US009021795B2

(12) United States Patent
Spieth et al.

(10) Patent No.: US 9,021,795 B2
(45) Date of Patent: May 5, 2015

(54) HEAT TRANSFER DEVICE AND MANUFACTURING METHOD

(75) Inventors: Arnulf Spieth, Hochdorf (DE); Anika Bürkle, Stuttgart (DE); Ming Dong, Stuttgart (DE); Jörg Oesterle, Laichingen (DE); Angela Hettel, Leinfelden-Echterdingen (DE)

(73) Assignee: Eberspaecher Exhaust Technology GmbH & Co. KG, Neunkirchen (DE)

( * ) Notice: Subject to any disclaimer, the term of this patent is extended or adjusted under 35 U.S.C. 154(b) by 1055 days.

(21) Appl. No.: 13/087,743

(22) Filed: Apr. 15, 2011

(65) Prior Publication Data
US 2011/0252774 A1 Oct. 20, 2011

(30) Foreign Application Priority Data

Apr. 17, 2010 (DE) .......................... 10 2010 015 321

(51) Int. Cl.
| | |
|---|---|
| F01N 3/02 | (2006.01) |
| H01L 35/30 | (2006.01) |
| F01N 5/02 | (2006.01) |
| F28D 7/00 | (2006.01) |
| F28D 21/00 | (2006.01) |
| F28F 13/00 | (2006.01) |

(52) U.S. Cl.
CPC ................ *H01L 35/30* (2013.01); *F01N 5/025* (2013.01); *F28D 7/0025* (2013.01); *F28D 21/0003* (2013.01); *Y02T 10/16* (2013.01); *F28F 2013/006* (2013.01)

(58) Field of Classification Search
CPC ....................................................... F01N 5/025
USPC ..................................... 60/275, 320; 136/205
See application file for complete search history.

(56) References Cited

U.S. PATENT DOCUMENTS

| 4,730,459 A | 3/1988 | Schlicklin et al. |
| 6,407,965 B1 | 6/2002 | Matoge et al. |
| 2004/0177623 A1* | 9/2004 | Zelissen et al. ................... 62/3.7 |
| 2006/0157102 A1 | 7/2006 | Nakajima et al. |
| 2008/0142067 A1 | 6/2008 | Dell et al. |

FOREIGN PATENT DOCUMENTS

| AT | 506 262 A2 | 7/2009 |
| CN | 1605740 A | 4/2005 |
| DE | 60207230 T2 | 7/2006 |
| DE | 102007035931 A1 | 2/2009 |
| EP | 1 522 685 A1 | 4/2005 |
| GB | 2 336 943 A | 11/1999 |
| JP | 2003110156 A | 4/2003 |
| JP | 2009295752 A | 12/2009 |
| WO | WO 2010/112571 A2 | 10/2010 |

* cited by examiner

*Primary Examiner* — Kenneth Bomberg
*Assistant Examiner* — Jonathan Mathias
(74) *Attorney, Agent, or Firm* — Reinhart Boerner Van Deuren P.C.

(57) ABSTRACT

The present invention relates to a heat transfer device, more preferably for an exhaust system of a combustion engine, preferentially of a motor vehicle, with at least one warm tube for conducting a fluid emitting heat, with at least one cold tube for conducting a fluid absorbing heat and with at least one thermoelectric generator for generating electric energy from a temperature difference, wherein a thermoelectric generator each is arranged between a warm tube and a cold tube. The efficiency of the heat transfer device is improved if the respective thermoelectric generator is in contact with the respective tube via a heat conducting material and if the respective heat conducting material is configured as shaped body.

19 Claims, 3 Drawing Sheets

HEAT TRANSFER DEVICE AND MANUFACTURING METHOD

CROSS-REFERENCE TO RELATED PATENT APPLICATIONS

This patent application claims the benefit of German Patent Application No. 10 2010 015321.4, filed Apr. 17, 2010, the entire teachings and disclosure of which are incorporated herein by reference thereto.

FIELD OF THE INVENTION

The present invention relates to a heat transfer device, more preferably for an exhaust system of a combustion engine, preferentially of a motor vehicle. The invention additionally relates to a method for the assembly of such a heat transfer device.

BACKGROUND OF THE INVENTION

A heat transfer device usually comprises at least one warm tube for conducting a fluid containing or emitting heat and at least one cold tube for conducting a fluid absorbing heat. These tubes are coupled to each other in a heat-transferring manner so that heat from the fluid of the warm tube can be transferred into the fluid of the cold tube.

Here it is possible in principle to arrange at least one thermoelectric generator between warm tube and cold tube with the help of which electric energy can be generated from a heat flow or from a temperature difference. Such a thermoelectric generator corresponds to a Peltier element. With the Peltier element or with the thermoelectric generator, which can also be called TEG, a heat flow is generated from a voltage difference by utilising the Peltier effect. The reversal of this Peltier effect is the Seebeck effect, which generates an electric current from a temperature difference. In addition, semiconductors at different energy level are utilised with a TEG or Peltier element.

Since in the exhaust gas of a combustion engine a lot of waste heat is usually present it is possible, by using such a heat transfer device with at least one integrated TEG, to recover energy in form of heat and electric current. This energy can then be utilised elsewhere on the combustion engine or a vehicle equipped with such in order to improve the overall efficiency of the respective system.

SUMMARY OF THE INVENTION

The present invention deals with the problem of stating an improved or at least another embodiment for such a heat transfer device or for an associated manufacturing method which is more preferably characterized by improved efficiency of the heat transfer device and through a simplified manufacture of the heat transfer device.

According to the invention, this problem is solved through the subject of the independent claims. Advantageous embodiments are the subject of the dependent claims.

The invention is based on the general idea of arranging a heat conducting material between the respective TEG and the respective tube which improves the heat transfer between the respective TEG and the respective tube. An improved heat transfer increases the heat flow and ultimately the temperature difference between warm side and cold side of the respective TEG. Since the electric current generateable with the help of the respective TEG depends on the temperature difference, an increased temperature difference results in an increased current production.

Of particular advantage is a special embodiment wherein the respective heat conducting material is configured as shaped body. The use of such a shaped body produced of heat conducting material makes possible an improved geometrical adaptation of the heat conducting material to the respective tube on the one hand and the respective TEG on the other hand. An improved geometrical adaptation results in a large-area more preferably continuous contact which improves the heat transfer. On the other hand, the shaped body because of its shaping can be utilised for positioning the respective TEG relative to the respective tube—and vice versa—, which is an advantage particularly during the manufacture, that is during the assembly of the heat transfer device. For example, several cold tubes, warm tubes and thermoelectric generators can be stacked on top of one another more easily with the help of these shaped bodies, which simplifies the handling of the individual components during the production process.

In addition to this it has been shown that by using such shaped bodies it is possible to select a comparatively high contact pressure orientated in the stacking direction of the individual components. On the one hand, a geometrical adaptation of the shaped body to the respective tubes and to the respective TEG results in a uniform surface pressure which homogenises and thus reduces the loading of the individual components. On the other hand, the position fixing or positioning of the individual components relative to one another improved with the help of the shaped bodies guarantees a stable composite even with increased contact pressures which more preferably—depending on configuration—can even become more stable with increasing contact pressure.

Of particular advantage is an embodiment wherein the respective TEG is held in position on the respective tube with the help of the respective shaped body. This design thus improves the fixing effect or holding effect of the respective shaped body. This can be realised for example through a corresponding complementary shaping of the respective shaped body to the respective TEG on the one hand and to the respective tube on the other hand.

According to another advantageous embodiment at least one elevation or depression can be formed on the respective shaped body which interacts with a depression or elevation complementary thereto, which is formed on the respective TEG or on the respective tube. Such an elevation can be formed for example linearly in form of a bead or concentrated in the form of a projection. The depression complementary thereto is then formed as a mating bead or mating projection thereto. Here it is clear that any number of beads and projections can be combined. Likewise, differently dimensioned beads or projections can be present.

By using such interacting elevations and depressions which are particularly in engagement with one another a positive positioning between the respective shaped body and the respective TEG or the respective tube can be realised. Here, the positive positioning acts transversely to a stacking direction of the components located on top of one another.

The respective elevation or depression or an elevation arrangement or depression arrangement consisting of several elevations or depressions can laterally embrace the respective TEG or at least a thermoelectric generator element of a TEG formed of several TEG elements. Because of this, a positive positioning of the TEG transversely to the stacking direction is realised in all directions.

According to another advantageous embodiment the respective shaped body can have a rim which at least partially laterally encloses the respective TEG or at least one TEG element. With the help of such a rim, too, an effective positive positioning of the respective shaped body on the respective TEG or on the respective tube can be realised transversely to the stacking direction.

With another embodiment at least one frame can be provided as further component which laterally encloses the respective TEG. Particularly in the event that the TEG consists of several TEG elements which are arranged next to one another, such a frame simplifies the positioning and handling of the TEG during the assembly and in the finished heat transfer device.

According to an advantageous further development the respective shaped body can be supported on the respective frame as a result of which an additional stabilisation within the structure of the heat transfer device can obtained.

It is particularly practical to integrate electrical lines in the respective shaped body for the electrical contacting of the respective TEG or of the respective TEG elements. Because of this, the respective shaped body receives an additional function which simplifies the electrical contacting of the respective TEG within the heat transfer device. In particular, the installation of additional electrical lines within the heat transfer unit can be omitted.

The respective shaped body can be dimensionally stable and/or elastic. It can be glued to the respective tube or to the respective TEG. The heat conducting material, of which the shaped body is formed, can be designed in an electrically insulating manner. It can be fibre-reinforced. In addition, the heat conducting material can comprise graphite as basic material provided it is produced of a composite material. Likewise, the heat conducting material can consist entirely of graphite.

Further important features and advantages of the invention are obtained from the subclaims, from the drawings and from the corresponding figure description by means of the drawings.

It is to be understood that the features mentioned above and still to be explained in the following cannot only be used in the respective combination stated but also in other combinations or by themselves, without leaving the scope of the present invention.

BRIEF DESCRIPTION OF THE DRAWINGS

Preferred exemplary embodiments of the invention are shown in the drawings and are explained in more detail in the following description, wherein same reference characters refer to same or similar or functionally same components.

It shows, in each case schematically

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
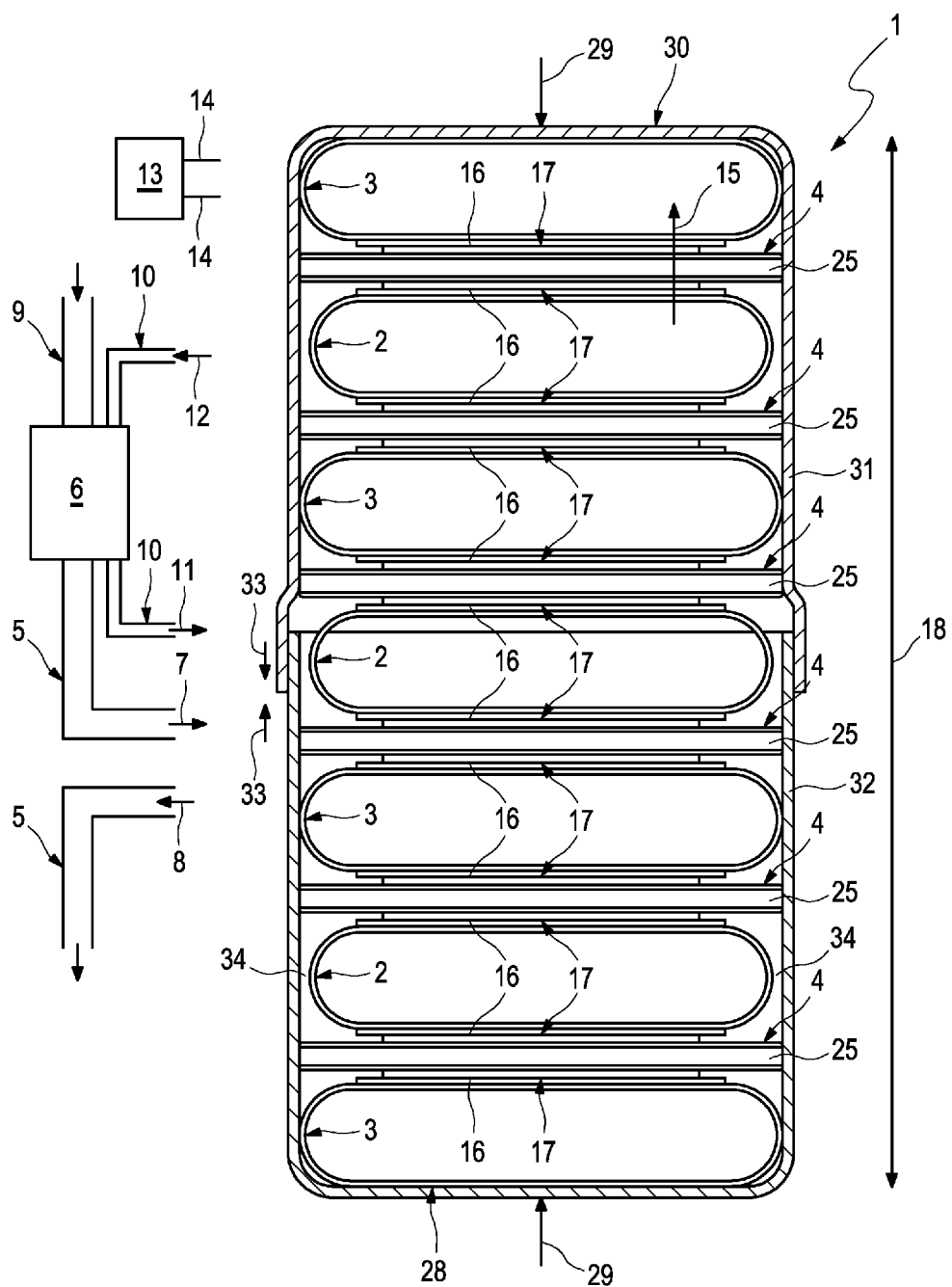
FIG. 1 is a cross section through a heat transfer device.

According to FIG. 1, a heat transfer device 1 shown in cross section comprises at least one warm tube 2 and at least one cold tube 3. The heat transfer device 1 shown in the example comprises three warm tubes 2 and four cold tubes 3. The warm tubes 2 during the operation of the heat exchanger 1 serve for conducting a fluid containing heat or emitting heat, while the cold tubes 3 during the operation of the heat transfer device 1 serve for conducting a fluid absorbing heat.

In addition, the heat transfer device 1 shown here includes at least one thermoelectric generator 4, which in the following is also called TEG 4. In the example, six such TEGs 4 are provided. The respective TEG 4 serves for generating electric energy or an electric current from a temperature difference or from a heat flow. To this end, the respective TEG 4 is arranged in each case between a warm tube 2 and a cold tube 3.

The heat transfer device 1 can for example be incorporated in an exhaust system 5 of a combustion engine 6 indicated on the left side in FIG. 1, which can more preferably be arranged in a vehicle. For example, the exhaust system 5 can conduct the hot exhaust gas of the combustion engine 6 to the heat transfer device 1 according to an inflow arrow 7, where it flows through the warm tubes 2. According to a return arrow 8, the exhaust gas cooled if applicable comes back from the warm tubes 2 of the heat transfer device 1 and continues on its way within the exhaust system 5. The combustion engine 6 additionally comprises a fresh air system 9 and can be equipped with a cooling circuit 10. For example, the heat transfer device 1 can also be incorporated in this cooling circuit 10. According to an advance arrow 11 a liquid coolant can be conducted to the cold tubes 3 of the heat transfer device 1. According to a return arrow 12 the coolant heated if applicable can be returned from the cold tubes 3 of the heat transfer device 1 into the cooling circuit 10. Because of this it is possible for example during a cold start of the combustion engine 6 and/or at low ambient temperatures, to introduce heat into the cooling circuit 10 in order to bring or keep the combustion engine 6 up to/at operating temperature. In addition or alternatively the heat transfer device 1 with its cold tubes 3 can also be incorporated in any other cooling circuit or in a heating circuit, for example in a heating circuit for heating a passenger compartment of the motor vehicle.

The TEGs 4 can be electrically connected to an electric consumer 13 of the combustion engine 6 or the vehicle equipped with such. Corresponding electrical connecting lines in this case are designated 14. The electric consumer 13 can comprise a potential transformer and a control unit, for example in order to feed the electric energy generated with the help of the TEGs 4 into a vehicle battery.

During the operation of the heat transfer device 1 a temperature difference is established between the warm tubes 2 and the cold tubes 3 which according to an arrow 15 results in a heat flow from a warm tube 2 to a cold tube 3, wherein the respective heat flow 15 passes through the TEG 4 arranged in between. This heat flow 15 or the underlying temperature difference between warm line 2 and cold line 3 results in an electric voltage in the respective TEG 4 which can be tapped off in form of electric current. To improve the heat flow 15, the respective TEG 4 is in contact with the respective tube 2, 3 via a heat conducting material 16. The respective heat conducting material 16 with the heat transfer device 1 presented here is designed as shaped body 17.

Figure 2:
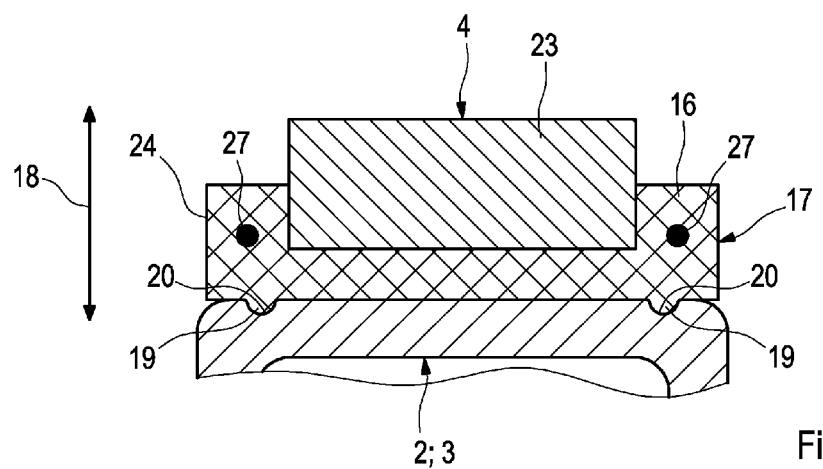
FIG. 2 is a cross section of the heat exchanger in the region of a thermoelectric generator.
Figure 3:
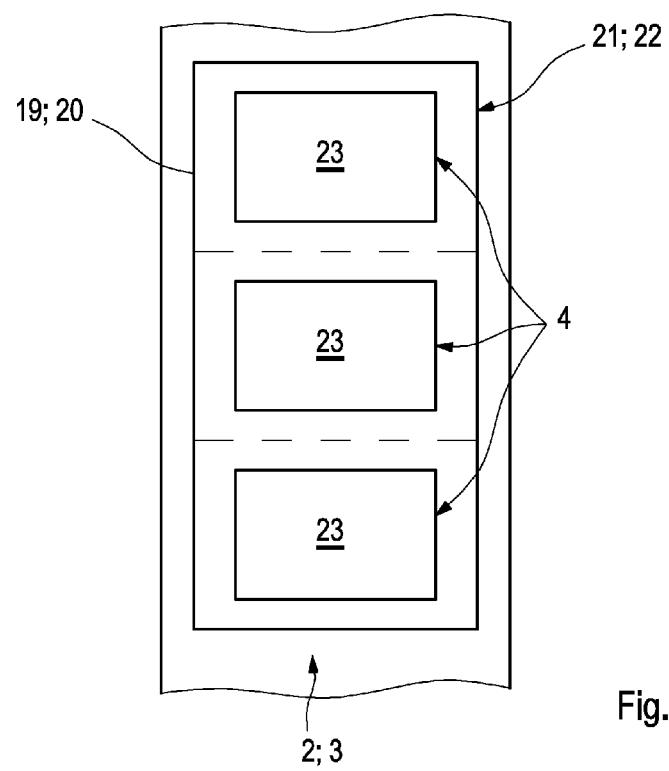
FIG. 3 is a top view of a detail of a thermoelectric generator.

The respective shaped body 17 according to FIGS. 2 and 3 can be configured so that it holds the respective TEG 4 in position on the respective tube 2 or 3. This positioning in this case is effected transversely to a stacking direction 18 indicated in FIGS. 1 and 2 by a double arrow, in which the individual tubes 2, 3 and the TEGs 4 as well as the shaped body 17 are stacked on top of one another or are arranged on top of one another within the heat transfer device 1.

To realise this positioning function at least one elevation 19 can be formed on the respective shaped body 17 according to FIGS. 2 and 3, while complementarily thereto on the respective TEG 4 or—as in the shown example—on the respective tube 2 or 3 a depression 20 matching said elevation is formed. The elevation 19 engages positively in the corresponding depression 20, namely in the stacking direction 18, as a result of which the desired positive positioning transversely to the stacking direction 18 can be realised. The respective elevation 19 can for example be realised linearly, for example through a bead. It is likewise possible to design the respective elevation 19 in a concentrated manner for example as projection. It is clear that in principle any combination of beads and projections can be provided in order to configure an elevation arrangement 21. The same then applies to the complementarily formed depressions 20, which accordingly can be formed as mating bead or mating projection and can form a depression arrangement 22 in any combination.

Although with the embodiment shown in FIG. 2 the elevations 19 are formed on the shaped body 17 and the depressions 20 matching said elevations are formed on the respective tube 2 or 3, it can be provided with another embodiment to form the depressions 20 on the respective shaped body 17, while the elevations 19 matching said depressions are then formed on the respective tube 2 or 3 or on the respective TEG 4. Likewise, combinations of elevations 19 and depressions 20 on the shaped body 17 in conjunction with corresponding depressions 20 or elevations 19 on the respective tube 2 or 3 or on the respective TEG 4 are conceivable.

Figure 4:
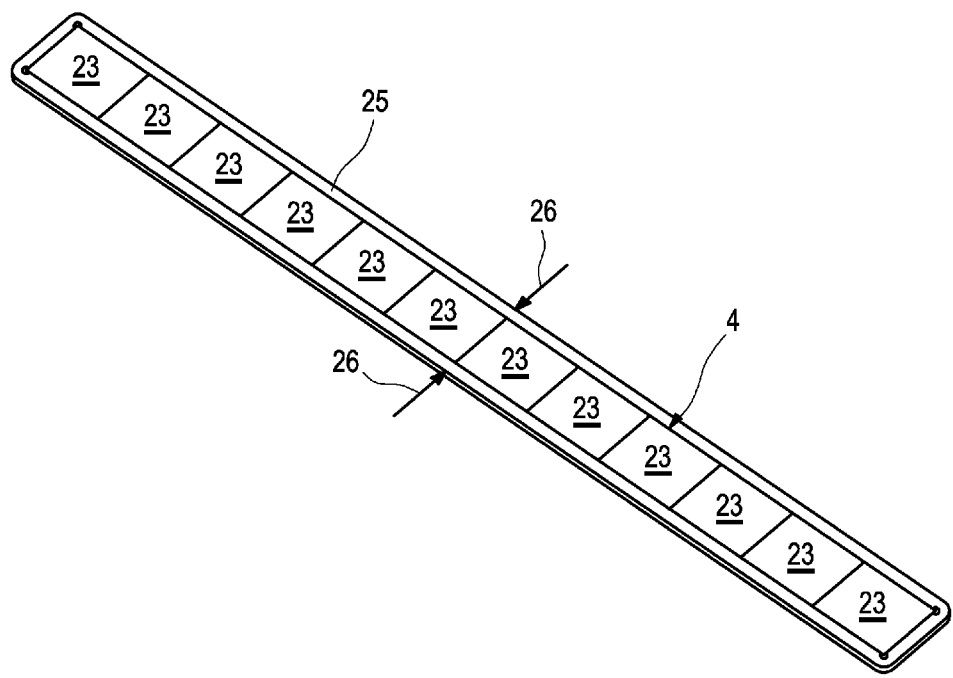
FIG. 4 is a perspective view of a thermoelectric generator with a frame.

Insofar as shown in FIG. 3 an elevation arrangement 21 consisting of several elevations 19 and/or a depression arrangement 22 consisting of several depressions 20 is or are provided, the respective elevation arrangement 21 or depression arrangement 22 can be configured so that it laterally, that is transversely to the stacking device 18, encloses the respective thermoelectric generator 4. In addition or alternatively it can be provided that the respective elevation arrangement 21 or the respective depression arrangement 22 laterally encloses a thermoelectric generator element 23, which in the following is also designated TEG element. A TEG 4 can be formed of several such TEG elements 23. For example, FIG. 4 shows an embodiment wherein an individual TEG 4 is constructed of a total of twelve TEG elements 23. The individual TEG elements 23 in this case lie next to one another in a line transversely to the stacking direction 18. Their number is determined from the length of the tubes 2, 3 used in the heat transfer device 1.

To illustrate the configuration of the elevation arrangement 21 or the depression arrangement 22 the shaped body 17 is not shown in FIG. 3. According to FIG. 2, the shaped body 17 can comprise a rim 24 which stands away from the remaining shaped body 17 in the stacking direction 18. The rim 24 in this case is positioned so that it at least partially laterally encloses the respective TEG 4 or at least one TEG element 23. In the example of FIG. 2, the rim 24 encloses the TEG 4 or the TEG element 23 on two opposite longitudinal sides. Said rim 24 can be provided additionally or alternatively to the elevations 19 or depressions 20. In the example, the rim 24 results in a lateral positioning of the TEG 4 or the respective TEG element 23 relative to the shaped body 17, while the elevations 19 and depressions 20 interacting with one another lead to the positioning of the respective tube 2 and 3 relative to the shaped body 17.

According to FIG. 4, in addition to the tubes 2, 3 and the TEGs 4 at least one frame 25 can be provided in the heat transfer device 1. Practically such a frame 25 is present in this case for each TEG 4. Accordingly, FIG. 1 shows a total of six such frames 25. The respective frame 25 forms a lateral enclosure that is an enclosure that is orientated transversely to the stacking direction 18 for the respective TEG 4. Noticeably, according to FIG. 4, all TEG elements 23 of the respective TEGs 4 are arranged in a row next to one another within the respective frame 25. This produces a positioning effect indicated in FIG. 4 through arrows 26 for the TEG or for its TEG elements 23, which is orientated transversely to the stacking direction 18 and transversely to the longitudinal direction of the tubes 2, 3 and thus transversely to the flow direction of the respective fluid in the respective tube 2, 3.

The respective shaped body 17 can now be configured according to a practical configuration that in the assembled state it is supported on the respective frame 25. Thus the positioning of the respective TEG 4 transversely to the stacking direction 18 can be indirectly realised with the help of the respective shaped body 17 via the positioning of the frame 25. For example, elevations 19 or depressions 20 can be provided on the shaped body 17, which engage in depressions 20 or elevations 19 complementarily thereto, which are then formed on the frame 25.

According to FIG. 2, electric lines 27 can be integrated in the shaped body 17, which in a suitable manner make possible electrical contacting of the respective TEG 4 or the respective TEG element 23. For example, the individual TEG elements 23 of the respective TEG 4 have to be connected electrically in series or electrically in parallel in order to realise the respective TEG 4. The respective switching of the TEG elements 23 can then be realised via the lines 27. Because of this, the shaped body 17 receives an important additional function, namely the electrical switching of the TEG elements 23. In addition, the electrical switching of the individual TEGs 4 within the heat transfer device 1 can also be substantially simplified with the help of the lines 27 integrated in the shaped body 17.

The shaped bodies 17 are practically designed dimensionally stable, as a result of which it is possible within the scope of the assembly of the heat transfer device 1 to securely stack several tubes 2, 3 and several TEGs 4 with the help of the shaped bodies 17. In addition, the shaped bodies 17 can be configured elastically, as a result of which upon compression parallel to the stacking direction 18 they can elastically yield so far that they can hug the outer contours of the tubes 2, 3 and TEGs 4, as a result of which a high-value areal contacting can be realised. The respective shaped body 17 can be glued to the respective tube 2, 3. Additionally or alternatively the respective shaped body 17 can be glued to the respective TEG 4 or to its TEG elements 23. Such gluing can simplify the handling during the assembly.

On its side facing the respective TEG 4 the respective shaped body 17 is formed complementarily to the side of the respective TEG 4 facing the shaped body 17. In addition or alternatively, the respective shaped body 17 on its side facing the respective tube 2, 3 can be formed complementarily to the side of the respective tube 2, 3 facing the respective shaped body 17. The complementary shaping simplifies a large-area contacting which improves the heat transfer.

The heat conducting material 16 used for producing the shaped body 17 can be electrically insulating according to a preferred embodiment. The heat conducting material 16 can be fibre reinforced. For example it can contain glass fibres or graphite fibres. In addition, the heat conducting material 16 can be a composite material comprising several materials. For example, graphite can be used as base material for this composite. It is likewise possible to produce the heat conducting material 16 only or completely from graphite.

According to FIG. 1 the tubes 2, 3, the shaped bodies 17 and the TEGs 4 form a stack 28 in the stacking direction 18. Preferred now is an embodiment, wherein the individual components of the stack 28, that is the tubes 2, 3, the TEGs 4 and the shaped bodies 17 in the stack 28 are preloaded against one another with a preload force 29 indicated through arrows in FIG. 1. This preload force 29 acts parallel to the stacking direction 18.

The heat transfer device 1 according to FIG. 1 comprises a housing 30 having two housing parts 31 and 32. In FIG. 1, a pot-shaped or in cross section U-shaped upper housing part 31 and a pot-shaped or in cross section U-shaped lower housing part 32 are noticeable. The two housing parts 31, 32 are inserted into one another according to the arrows 33. This insertion direction 33 runs parallel to the stacking direction 18. The stack 28 is arranged in the housing 30, that is in the two housing parts 31, 32. The preload force 29 is exerted on the stack 28 via the housing parts 31, 32.

With the embodiment shown in FIG. 1 the cold tubes 3 are dimensioned so that they laterally touch the housing 30 transversely to the through-flow direction and transversely to the stacking direction 18. The frames 25, too, are dimensioned in this case so that they laterally touch the housing 30 transversely to the through-flow direction and transversely to the stacking direction 18. In contrast with this, the warm tubes 2 in this case are dimensioned so that they are spaced from the housing 30 transversely to the through-flow direction and transversely to the stacking direction 18. Noticeable in this case is a gap 34 between the respective warm tube 2 and the housing 30. With the help of this gap 34 thermally induced stresses in the housing 30 can be avoided, which can occur due to a thermal expansion of the warm tubes 2 during the operation of the heat exchanger 1.

The heat transfer device 1 introduced here can be assembled in accordance with an advantageous manufacturing method as follows:

Initially, the stack 28 is build-up in that the respective tubes 2, 3 and the respective TEG 4 are stacked on top of one another with shaped bodies 17 arranged in between. This stack 28 is accommodated in the housing 30. Here it is possible in principle to already construct the stack 28 in the housing 30 or in at least one of the housing parts 31, 32.

Following the accommodating of the stack 28 in the housing 30 the housing parts 31, 32 are preloaded in the stacking direction 18 in order to generate the preload force 29 in the stack 28. In this preloaded state the relative position between the housing parts 31, 32 can be fixed. This position fixing can for example be realised by means of at least one clamping strap enclosing the housing parts 31, 32. In addition or alternatively it is likewise possible to realise this position fixing with the help of a fastening, which fixes the two housing parts 31, 32 to each other in their relative position. For example, the housing parts 31, 32 can be welded together.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A heat transfer device, comprising:
   at least one warm tube for conducting a fluid emitting heat,
   at least one cold tube for conducting a fluid absorbing heat,
   at least one thermoelectric generator for generating electric energy from a temperature difference, wherein one of the at least one thermoelectric generator is arranged between one of the at least one warm tube and one of the at least one cold tube
   wherein said one of the at least one thermoelectric generator is in contact with said at least one warm and cold tubes via a heat conducting material,
   wherein the heat conducting material is configured as a shaped body,
   wherein on the shaped body several elevations and/or depressions are formed which interact with a depression or elevation complementary thereto, which is formed on said one of the at least one thermoelectric generator or on said at least one warm and cold tubes.

2. The heat transfer device according to claim 1, wherein said one of the at least one thermoelectric generator is held in position on said ones of the at least one warm and cold tubes with the help of the shaped body.

3. The heat transfer device according to claim 1, wherein the several elevations and/or depressions are in the form of a bead or protection or in the form of a complementary mating bead or projection.

4. The heat transfer device according to claim 1, wherein the several elevations and/or depressions laterally enclose said one of the at least one thermoelectric generator or at least one thermoelectric generator element of said one of the at least one thermoelectric generator, said one of the at least one thermoelectric generator being formed of several thermoelectric generator elements.

5. The heat transfer device according to claim 1, wherein in the shaped body electrical lines are integrated for providing an electrical contact of said one of the at least one of the thermoelectric generator and thermoelectric generator elements of said one of the at least one thermoelectric generator consisting of several thermoelectric generator elements.

6. The heat transfer device according to claim 1, wherein the shaped body is configured dimensionally stable.

7. The heat transfer device according to claim 1, wherein the shaped body is configured elastically.

8. The heat transfer device according to claim 1, wherein the shaped body is glued to said ones of the at least one warm and cold tubes and said one of the at least one thermoelectric generator.

9. The heat transfer device according to claim 1, wherein the heat conducting material is electrically insulating.

10. The heat transfer device according to claim 1, wherein the heat conducting material is fibre reinforced.

11. The heat transfer device according to claim 1, wherein the heat conducting material comprises graphite as base material or consists completely of graphite.

12. The heat transfer device according to claim 1, wherein the at least one warm and cold tubes, the shaped body and the at least one thermoelectric generator are arranged in a direction to form a stack, in which they are clamped against one another with a preload force in said direction.

13. The heat transfer device according to claim 12, wherein a housing is provided in which the stack is arranged and which comprises two housing parts inserted into each other, via which the preload force is exerted on the stack.

14. The heat transfer device according to claim 1, wherein the at least one cold tube laterally touches a housing of the heat transfer device transversely to a through-flow direction of the heat transfer device.

15. The heat transfer device according to claim 1, wherein the at least one warm tube is laterally spaced from a housing of the heat transfer device transversely to a through-flow direction of the heat transfer device.

16. A heat transfer device, comprising:
at least one warm tube for conducting a fluid emitting heat,
at least one cold tube for conducting a fluid absorbing heat,
at least one thermoelectric generator for generating electric energy from a temperature difference, wherein one of the at least one thermoelectric generator is arranged between one of the at least one warm tube and one of the at least one cold tube
wherein said one of the at least one thermoelectric generator is in contact with said at least one warm and cold tubes via a heat conducting material,
wherein the heat conducting material is configured as a shaped body,
wherein
at least one frame is provided which laterally encloses said one of the at least one thermoelectric generator.

17. The heat transfer device according to claim 16, wherein the shaped body is supported on the at least one frame.

18. The heat transfer device according to claim 16, wherein the at least one frame laterally touches a housing of the heat transfer device transversely to a through-flow direction of the heat transfer device.

19. A heat transfer device, comprising:
at least one warm tube for conducting a fluid emitting heat,
at least one cold tube for conducting a fluid absorbing heat,
at least one thermoelectric generator for generating electric energy from a temperature difference, wherein one of the at least one thermoelectric generator is arranged between one of the at least one warm tube and one of the at least one cold tube
wherein said one of the at least one thermoelectric generator is in contact with said ones of the at least one warm and cold tubes via a heat conducting material,
wherein the heat conducting material is configured as a shaped body,
wherein
the shaped body comprises a rim which at least partially laterally encloses said one of the at least one thermoelectric generator or at least one thermoelectric generator element of said one of the at least one thermoelectric generator, said one of the at least one thermoelectric generator being formed of several thermoelectric generator elements.

\* \* \* \* \*

UNITED STATES PATENT AND TRADEMARK OFFICE
CERTIFICATE OF CORRECTION

| | | |
|---|---|---|
| PATENT NO. | : 9,021,795 B2 | Page 1 of 1 |
| APPLICATION NO. | : 13/087743 | |
| DATED | : May 5, 2015 | |
| INVENTOR(S) | : Arnulf Spieth et al. | |

It is certified that error appears in the above-identified patent and that said Letters Patent is hereby corrected as shown below:

Claims

Column 10, line 27, remove --ones of the--

Signed and Sealed this
Sixth Day of October, 2015

Michelle K. Lee
*Director of the United States Patent and Trademark Office*